United States Patent [19]
Kobayashi et al.

[11] Patent Number: 6,004,406
[45] Date of Patent: Dec. 21, 1999

[54] SILICON ON INSULATING SUBSTRATE

[75] Inventors: Kenya Kobayashi; Tomohiro Hamajima; Kensuke Okonogi, all of Tokyo, Japan

[73] Assignee: NEC Corporation, Japan

[21] Appl. No.: 08/490,351

[22] Filed: Jun. 14, 1995

[30] Foreign Application Priority Data

Jun. 16, 1994 [JP] Japan .................................. 6-156451

[51] Int. Cl.⁶ .......................... H01L 49/02; H01L 29/06
[52] U.S. Cl. ..................... 148/33.3; 257/505; 257/524
[58] Field of Search ................... 437/62, 86, 974, 437/228; 148/DIG. 12, DIG. 85, DIG. 86, 33.3; 156/632.1; 257/505, 524

[56] References Cited

U.S. PATENT DOCUMENTS

| | | |
|---|---|---|
| 4,837,186 | 6/1989 | Ohata et al. . |
| 4,963,505 | 10/1990 | Fujii et al. . |
| 5,138,421 | 8/1992 | Saito . |
| 5,356,827 | 10/1994 | Ohoka . |
| 5,374,582 | 12/1994 | Okonogi et al. ................. 148/DIG. 12 |

FOREIGN PATENT DOCUMENTS

| | | |
|---|---|---|
| 0553857 | 8/1993 | European Pat. Off. . |
| 3-82138 | 4/1991 | Japan . |
| 3-266450 | 11/1991 | Japan . |
| 4-29353 | 1/1992 | Japan . |
| 5-267439 | 10/1993 | Japan . |

*Primary Examiner*—George R. Fourson
*Attorney, Agent, or Firm*—Hayes, Soloway, Hennessey, Grossman & Hage, P.C.

[57] ABSTRACT

A first silicon single crystal substrate and a second silicon single crystal substrate are bonded together and the first silicon single crystal substrate is formed thin as an SOI layer. An insulation film is buried in portions of the bonding surface of one of the two silicon single crystal substrates, and in addition, a polycrystal silicon layer is formed on the bonding surface of the silicon single crystal substrate on the side into which the insulation film is buried.

2 Claims, 8 Drawing Sheets

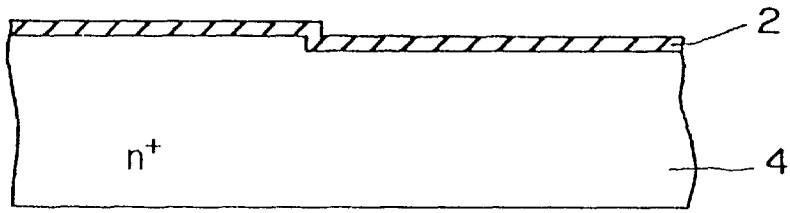
Fig. 1 (a) PRIOR ART
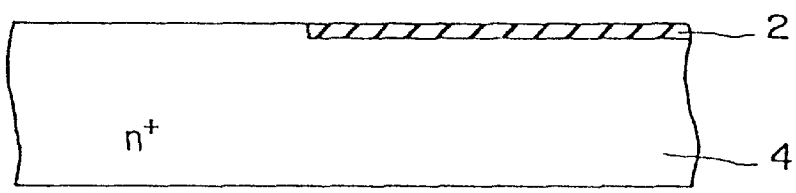
Fig. 1 (b) PRIOR ART
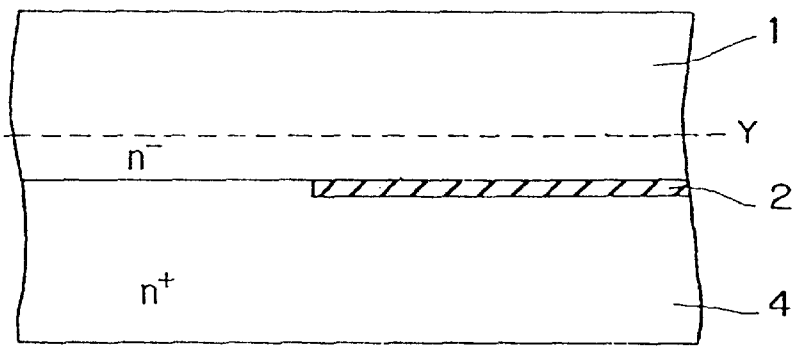
Fig. 1 (c) PRIOR ART
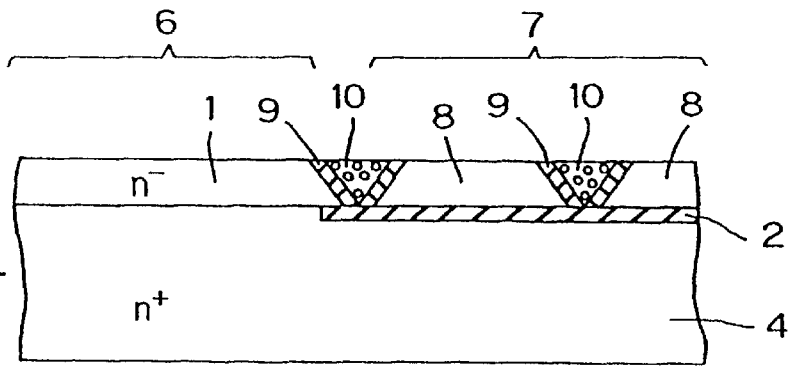
Fig. 1 (d) PRIOR ART

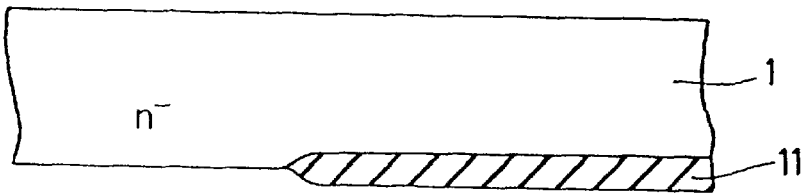
Fig. 2 (a) PRIOR ART
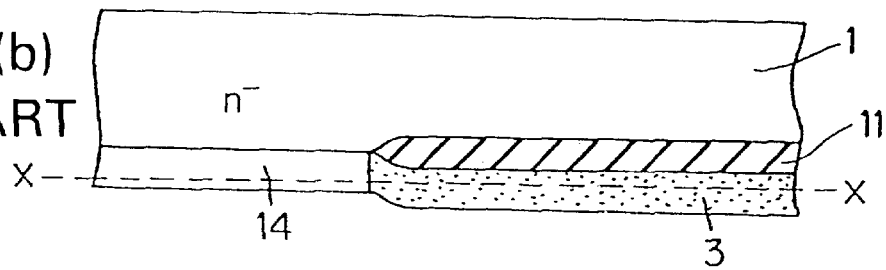
Fig. 2 (b) PRIOR ART
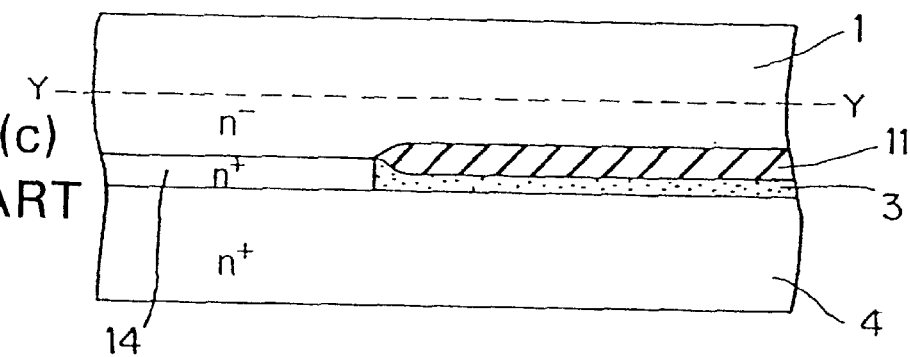
Fig. 2 (c) PRIOR ART
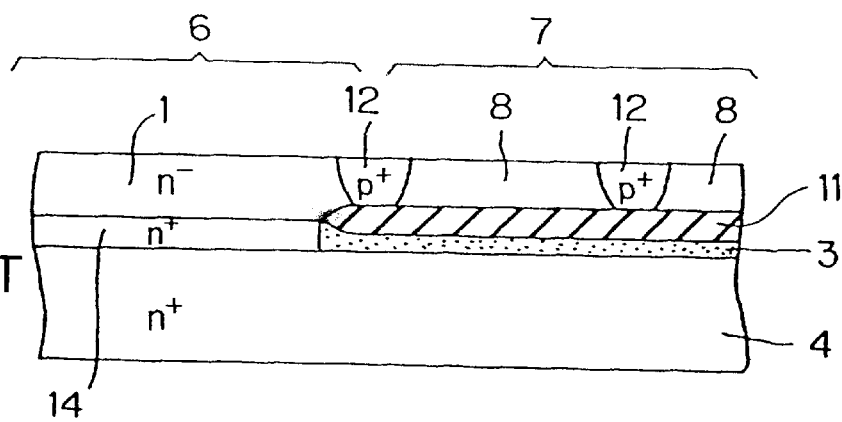
Fig. 2 (d) PRIOR ART

SILICON ON INSULATING SUBSTRATE

BACKGROUND OF THE INVENTION

1. Field of the Invention

The present invention relates to a Silicon On Insulating (SOI) substrate and its method of manufacture, and in particular, relates to an SOI substrate that is useful in a power IC, and its method of manufacture.

2. Description of the Related Art

When monolithically integrating high-voltage vertical power elements and control circuit elements having current routes from the front to rear surface of a silicon substrate, partial SOI substrates are used that have been treated so as to allow the formation of only the control circuit elements on the SOI layer. This type of partial SOI substrate is disclosed in Japanese patents laid-open No. 29353/92 and No. 82138/91.

FIG. 1 shows sectional views of the progression of steps in a manufacturing method of SOI substrates (to be referred to as "the first example of the prior art") disclosed in Japanese patent laid-open No. 29353/92.

First, as shown in FIG. 1a, a photoresist is formed by photolithography in a prescribed pattern on one main surface of an n$^+$-type silicon single crystal substrate 4. This photoresist is used as a mask to form a shallow step by, for example, an ion etching method, and an SiO$_2$ insulation film 2 is formed by a method such as thermal oxidation or low-temperature chemical vapor deposition (CVD).

Next, as shown in FIG. 1b, the protruding step portion of the insulation film 2 is removed by means of grinding-polishing or etching, and the exposed surface of the n$^+$-type silicon single crystal substrate 4 and the insulation film 2 are leveled.

The level surface obtained by the above-described steps is bonded to one main surface of an n$^-$-type silicon single crystal substrate 1 and subjected to heat treatment to obtain a single firmly bonded compound substrate (FIG. 1c). Next, the n$^-$-type silicon single crystal substrate 1 is ground and polished as far as the Y—Y plane shown in FIG. 1c to make the silicon substrate 1 a desired thickness as well as to level its surface. Next, an insulation film is formed on this leveled surface, the insulation film is patterned by means of photoetching, and using this film as a mask, alkali etching is carried out to form isolation grooves for isolation, thereby both isolating a vertical power element formation zone 6 and a control circuit element formation zone 7 and dividing the silicon single crystal substrate 1 of control circuit element formation zones 7 into silicon single crystal islands 8.

Next, an insulation film 9 composed of, for example SiO$_2$, is formed across the entire surface of the n$^-$-type silicon single crystal substrate 1 by thermal oxidation or low-temperature CVD, following which a polycrystalline silicon layer 10 is formed by CVD. The polycrystalline silicon layer 10 and insulation film 9 on the substrate main surface are next removed by grinding-polishing or etching, leaving the isolation grooves covered by the insulation film 9 and polycrystalline silicon film 10 to produce an SOI substrate with insulated and isolated element formation zones (FIG. 1d).

Next, as another example of the prior art to be referred to hereinbelow as "the second prior art example," explanation is given with reference to FIG. 2 regarding the partial SOI substrate disclosed by Japanese patent laid-open No. 82138/91.

First, as shown in FIG. 2a, a prescribed portion of one main surface of an n$^-$-type silicon single crystal substrate 1 is oxidized by a selective oxidation method to form a LOCOS oxide film 11. Next, as shown in FIG. 2b, on the side of the silicon substrate 1 on which the LOCOS oxide film has formed, epitaxial growth of silicon is carried out by CVD to form an n$^+$-type silicon single crystal layer 14 on the portion of the main surface of the n$^-$-type silicon single crystal substrate 1 not covered by the LOCOS oxide film 11, and a polycrystalline silicon layer 3 is formed on the LOCOS oxide film 11. Next, a mechanochemical grinding method is employed to grind as far as the X—X plane to make the surfaces of the n$^+$-type silicon single crystal layer 14 and the polycrystalline silicon layer 3 a single level plane.

Next, as shown in FIG. 2c, an n$^+$-type silicon single crystal substrate 4 is bonded to the flat plane of the n$^+$-type silicon single crystal layer 14 and the polycrystalline silicon layer 3 formed on the main surface of the n$^-$-type silicon single crystal substrate 1, and a heat process is carried out to obtain a single compound substrate.

Finally, as shown in FIG. 2d, the surface of the n$^-$-type silicon single crystal substrate 1 is ground and polished as far as the Y—Y plane shown in FIG. 2c to produce a level surface, following which, by diffusing p-type impurities at high concentration at prescribed locations to form p$^+$-type diffusion layers 12, a vertical power element formation zone 6 and a control circuit element formation zone 7 are isolated and the silicon single crystal substrate 1 of the control circuit element formation zone 7 is divided into silicon single crystal islands 8.

In the first example of the prior art described hereinabove, silicon single crystal and silicon oxide film (or silicon nitride film) are mixed on the bonding surface of an SOI substrate, and in the second example of the prior art, silicon single crystal and polycrystalline silicon are mixed on the bonding side of an SOI substrate. When leveling a surface in which differing substances are mixed in this way, suppressing variations in surface level to less than 100 Å is extremely difficult using current grinding or etching technology. For this reason, insufficient flatness in the bonding surface may give rise to voids in the bonded plane, and as a consequence, there is the problem that peeling may originate from the vicinity of these voids during subsequent heat treatments, thereby causing the vertical power elements to be inoperable.

SUMMARY OF THE INVENTION

The object of the present invention is to improve the evenness of a bonding surface in which differing substances are mixed to provide a highly reliable SOI substrate having no voids in its plane of bonding, and to provide a manufacturing method for such an SOI substrate.

To achieve the above-described object according to the present invention, an SOI substrate is provided in which a first silicon single crystal substrate and a second silicon single crystal substrate are bonded together, the first silicon single crystal substrate being formed thin as an SOI layer, an insulation film being buried in portions of the surface of the bonding side of either one of the silicon single crystal substrates, and moreover, a polycrystalline silicon layer being formed on the surface of the bonding side of the silicon single crystal substrate into which the insulation film is buried.

In addition, according to the present invention, an SOI substrate manufacturing method is provided comprising:

a first step in which a buried insulation film is formed in portions of one main surface of the first or the second silicon single crystal substrate;

a second step in which the surface of silicon single crystal on a main surface of a silicon single crystal substrate into which the insulation film is buried and the surface of the insulation film are made a level surface along the same plane;

a third step in which a polycrystalline silicon layer is formed on the leveled surface;

a fourth step in which the surface of the polycrystalline silicon layer is leveled by grinding and polishing;

a fifth step in which the leveled surface of the polycrystalline silicon layer is bonded together with one main surface of the first or second silicon single crystal substrate into which the insulation film is not buried, and the two substrates are subjected to a heat treatment to unify the two substrates;

and a sixth step in which the other main surface of the first silicon single crystal substrate is ground and polished to a thickness necessary for an SOI layer.

Through the above-described construction, minute unevenness resulting when leveling a surface in which a silicon single crystal is mixed with an insulation film can be absorbed in a polycrystalline silicon layer, and by grinding this polycrystalline silicon layer, an extremely even surface can be obtained.

In addition, because lower resistivity can be achieved through prior introduction of impurities or through diffusion of impurities from either or both silicon single crystal substrates to a polycrystalline silicon layer sandwiched between silicon single crystal substrates, it is possible to ensure that vertical power elements are virtually unaffected by the interposition of a polycrystalline silicon layer, and it is possible to maintain the reliability of an SOI substrate while forming power elements with required characteristics.

The above and other objects, features, and advantages of the present invention will become apparent from the following description based on the accompanying drawings which illustrate an example of a preferred embodiment of the present invention.

BRIEF DESCRIPTION OF THE DRAWINGS

FIGS. 1a to 1d are sectional views illustrating the process of the SOI substrate manufacturing method of the first example of the prior art;

FIGS. 2a to 2d are sectional views illustrating the process of the SOI substrate manufacturing method of the second example of the prior art;

DETAILED DESCRIPTION OF THE PREFERRED EMBODIMENTS

First Embodiment:

FIGS. 3a to 3f are sectional views of the progression of manufacturing steps and illustrate the structure and manufacturing method of an SOI substrate according to the first embodiment of the present invention.

Figure 3:
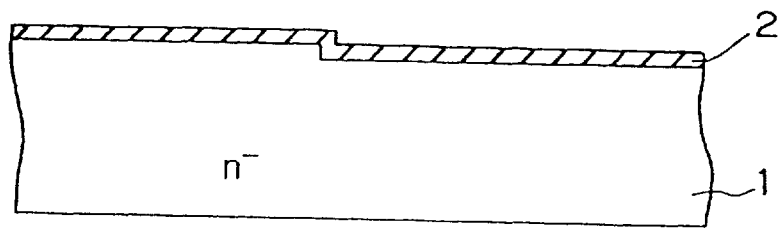
FIGS. 3a to 3f are sectional views illustrating the process of an SOI substrate manufacturing method according to the first embodiment of the present invention.
Figure 3:
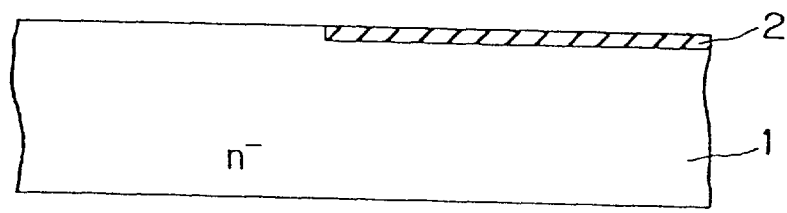
Figure 3:
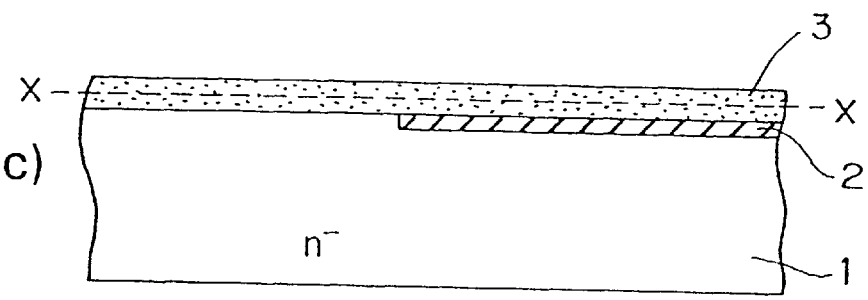
Figure 3:
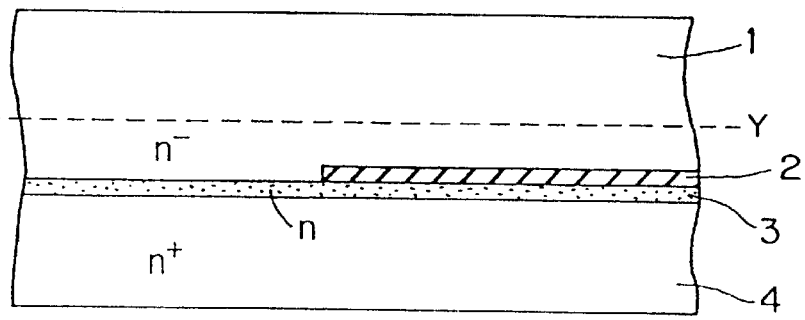
Figure 3:
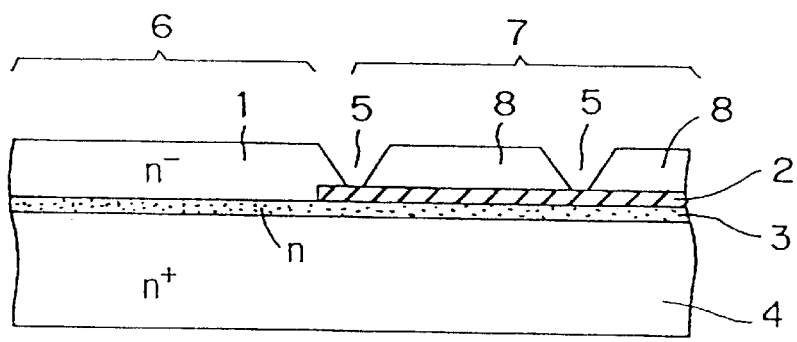
Figure 3:
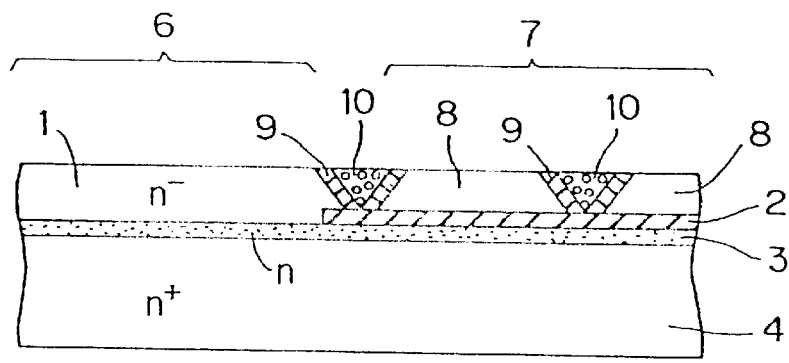

First, a silicon substrate is prepared having a concentration of impurities that is considered to enable the desired characteristics of a device to be formed. For example, an $n^-$-type silicon single crystal substrate 1 is prepared into which $10^{14}/cm^3$–$10^{15}/cm^3$ of phosphorus has been introduced, and on one main surface of this substrate a silicon oxide film (not shown) of uniform film thickness is formed by thermal oxidation. Then, by applying photolithography or dry etching, a prescribed portion of the silicon oxide film is removed to expose the silicon single crystal surface of this portion, and using the silicon oxide film as a mask, the silicon single crystal is etched to form a shallow step. The oxidized film used as a mask is then removed, following which an insulation film 2 of uniform film thickness is formed over the surface into which the shallow step has been formed (FIG. 3a). This insulation film 2 may be a silicon oxide film ($SiO_2$) formed by such processes as thermal oxidation or low-temperature CVD, or may be a silicon nitride film ($Si_3N_4$) formed by low-temperature CVD. The thickness of this insulation film 2 is of a degree suitable to bury the shallow step. The thickness of the substrate step and insulation film 2 is selected from a range between several 1000 Å and several $\mu$m according to the necessary isolation voltage.

Next, as shown in FIG. 3b, the protruding step portion of the insulation film 2 is removed by grinding-polishing or by etching, and the exposed surface of the $n^-$-type silicon single crystal substrate 1 and the surface of the insulation film 2 are made an approximately level surface, following which the step is further adjusted by using a selective grinding or etching method on either the silicon single crystal or the insulation film, or alternatively, by using a method that enables simultaneous grinding of both surfaces at the same speed. In either case, the surface is leveled such that the maximum surface irregularity over the wafer surface is of the order of several 100 Å.

Next, as shown in FIG. 3c, a polycrystalline silicon layer 3 is formed by a method such as CVD. The thickness of this polycrystalline silicon layer 3 is ideally of an order of 1–3 $\mu$m to allow covering of the aforementioned surface irregularities of an order of several 100 Å as well as to allow for necessary additional grinding and leveling. Next, the polycrystalline silicon layer 3 is ground and leveled as far as the X—X plane, and an extremely even surface is formed in which surface irregularities are reduced to a maximum of approximately several tens of Å across the wafer surface. Next, to make the polycrystalline silicon layer 3 conductive, impurities of a conduction type identical to that of the $n^-$-type silicon single crystal substrate 1 are introduced into the polycrystalline silicon layer by ion injection or impurity diffusion. Alternatively, impurities may also be introduced before grinding the polycrystalline silicon layer 3.

Next, as shown in FIG. 3d, one main surface of an $n^+$-type silicon single crystal substrate 4 of n-type and having an impurity concentration of $10^{18}/cm^3$, and the surface of an extremely even polycrystalline silicon layer 3 formed on a main surface of an $n^-$-type silicon single crystal substrate 1 are given a hydrophilic treatment, following which the two hydrophilically treated surfaces are bonded together and heat processed for two hours at 1100–1200° C. In this way, a single, firmly bonded compound substrate can be obtained.

Because the introduction of impurities to the polycrystalline silicon layer 3 is brought about by heat diffusion from the n+-type silicon single crystal substrate 4, which has a high impurity concentration, both during the heat treatment following bonding and during the heat treatment in subsequent device-forming processes, it is possible to omit special steps such as ion injection or impurity diffusion for introducing impurities into the polycrystalline silicon layer 3 before bonding.

The other main surface of the n−-type silicon single crystal substrate 1 is next ground and polished as far as the Y—Y plane to obtain an even surface while leaving the thickness necessary for an SOI layer. Next, a silicon oxide film (not shown) is formed in a uniform thickness by thermal oxidation or CVD, and patterning is carried out to remove the silicon oxide film at prescribed locations. This oxide film is used as a mask for forming isolation grooves 5 for element isolation by alkali etching or reactive ion etching (RIE), thereby isolating the vertical power element formation zone 6 and control circuit element formation zone 7 and dividing the silicon single crystal substrate 1 of the control circuit element formation zone 7 into silicon single crystal islands 8. The silicon oxide film used as a mask is then removed (FIG. 3e).

Next, an insulation film 9 composed of $SiO_2$ is formed over the entire surface of the silicon single crystal substrate 1 by such methods as thermal oxidation or low-temperature CVD, following which a polycrystalline silicon layer 10 is formed by CVD. The polycrystalline silicon layer 10 and insulation film 9 on the substrate surface are then removed by grinding-polishing or etching such that the isolation grooves 5 are filled in with the insulation film 9 and polycrystalline silicon layer 10 to obtain an SOI substrate in which each element formation zone is insulated and isolated (FIG. 3f).

Figure 4:
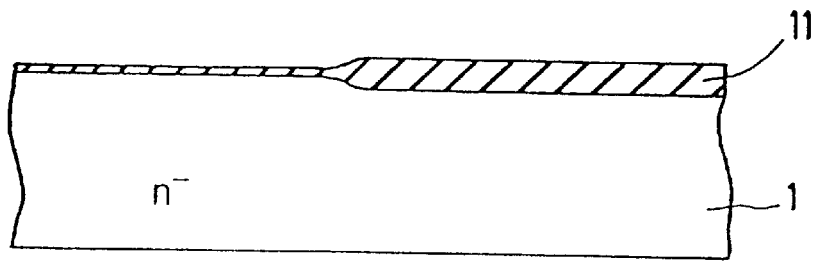
FIGS. 4a and 4b are sectional views illustrating the process of the SOI substrate manufacturing method according to the second embodiment of the present invention.
Figure 4:
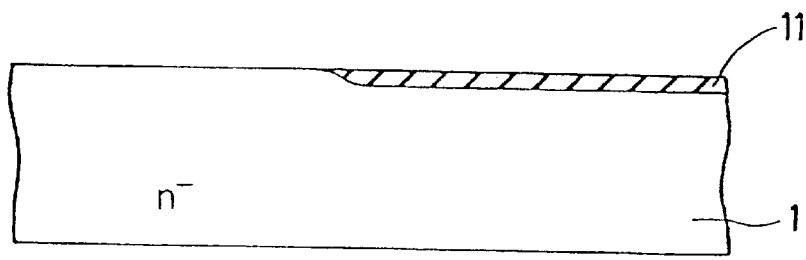

Second Embodiment:

FIGS. 4a and 4b are sectional views of the progression of steps illustrating the second embodiment of the present invention.

A silicon oxide film approximately 500 Å thick is formed by a method such as thermal oxidation on an n−-type silicon single crystal substrate 1 having a phosphorus concentration of the order of $10^{14}/cm^3$–$10^{15}/cm^3$, following which a silicon nitride film (neither film being shown) approximately 2500 Å thick is formed by CVD. After patterning the silicon nitride film, a LOCOS oxide film 11 is formed by steam thermal oxidation, and the silicon nitride film used as an oxide mask is removed (FIG. 4a).

The protruding LOCOS oxide film 11 portions are then removed by polishing and grinding or etching to expose part of the surface of the n−-type silicon single crystal substrate 1. The exposed surface of the silicon single crystal and the surface of the LOCOS oxide film 11 are further leveled such that surface irregularities across the surface of the wafer are reduced to a maximum of several 100 Å (FIG. 4b).

In addition, before thermal oxidation, the portion of the silicon substrate in which the LOCOS oxide film 11 is to be formed can also be slightly excavated to reduce dead space due to bird's leak.

Finally, the same processes as those shown in FIGS. 3c to 3f are applied to obtain an SOI substrate of the present embodiment.

Figure 5:
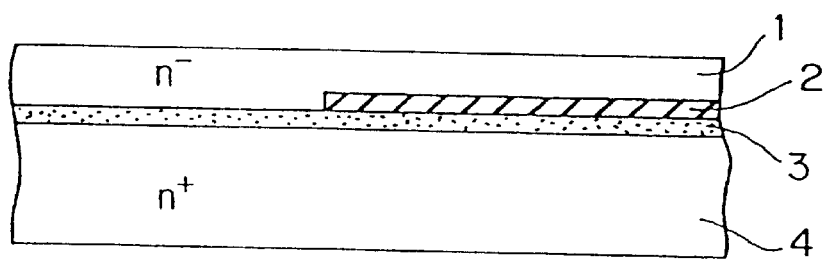
FIGS. 5a and 5b are sectional views illustrating the process of the SOI substrate manufacturing method according to the third embodiment of the present invention.
Figure 5:
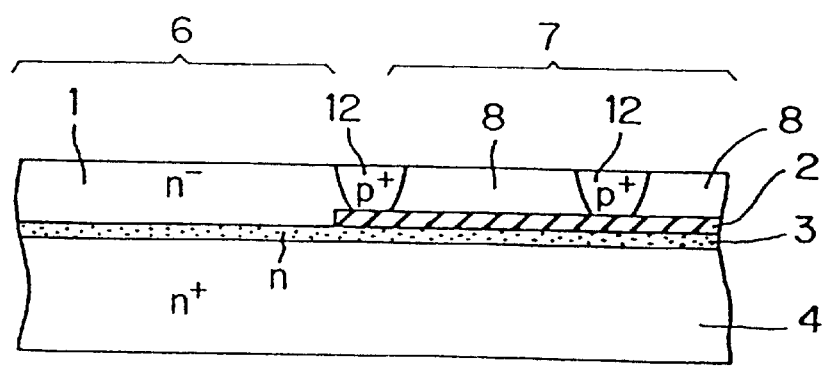

Third Embodiment:

FIGS. 5a and 5b are sectional views showing the progression of steps illustrating the manufacturing method of an SOI substrate according to the third embodiment of the present invention.

The bonded substrate shown in FIG. 3d is ground and polished as far as the Y—Y plane to obtain a compound substrate having a leveled surface as shown in FIG. 5a. Next, a photolithography method is applied to form a photoresist pattern which is used as a mask to inject boron at high concentration to form p+-type isolation areas 12 (FIG. 5b). These isolation areas 12 both isolate the vertical power element formation zone 6 and the control circuit element formation zone 7 as well as divide the silicon single crystal substrate 1 in the control circuit element formation zone 7 into silicon single crystal islands 8.

The third embodiment may be applied in cases allowing low isolation voltage between the vertical power element formation zones 7 and the control circuit element formation zones, and by omitting isolation processes involving isolation grooves 5 such as those in the first embodiment, this embodiment enables a simplification of the manufacturing process.

Fourth Embodiment:

FIGS. 6a–6f are sectional views of the progression of steps illustrating the manufacturing method according to the fourth embodiment of the present invention.

A silicon oxide film (not shown) of uniform thickness is first formed across a main surface of an n−-type silicon single crystal substrate 1 by, for example, thermal oxidation. Photolithography method and dry etching are then employed to remove the silicon oxide film at prescribed portions and expose the silicon single crystal surface at these prescribed portions, following which the silicon oxide film is used as a mask to etch the silicon single crystal and form shallow steps. Next, photolithography is applied to form a photoresist mask through which boron is ion-injected at an energy of 50 keV and a dosage of $2.5 \times 10^{14}/cm^2$ to form p+-type diffusion layers 12a (FIG. 6a).

Figure 6:
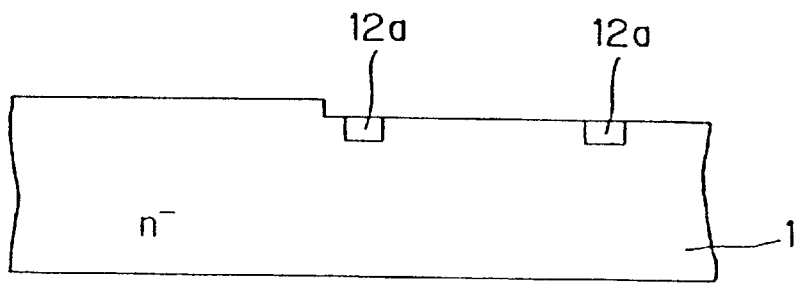
FIGS. 6a to 6f are sectional views illustrating the process of the SOI substrate manufacturing method according to the fourth embodiment of the present invention.
Figure 6:
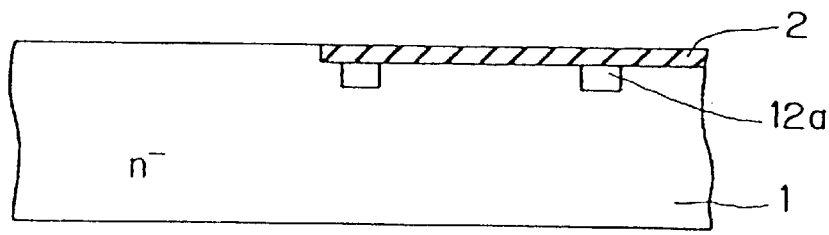
Figure 6:
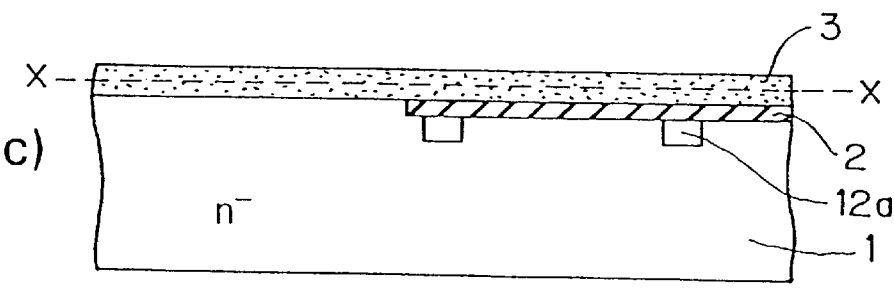
Figure 6:
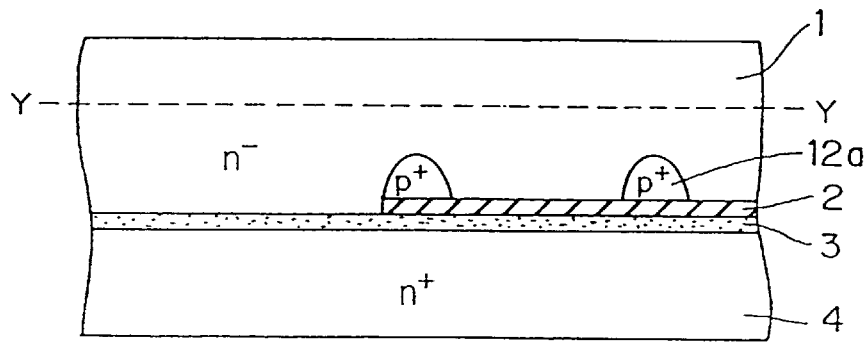
Figure 6:
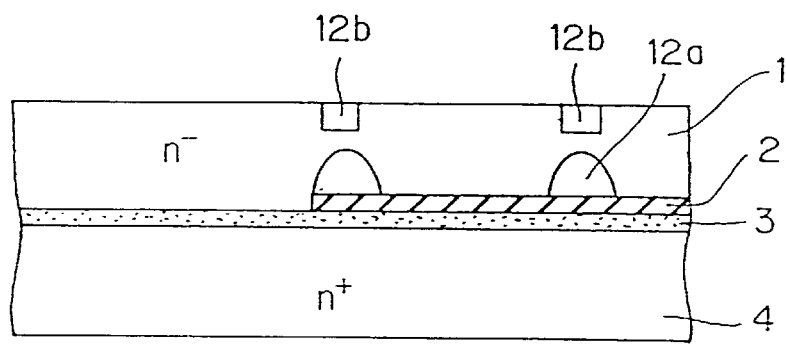
Figure 6:
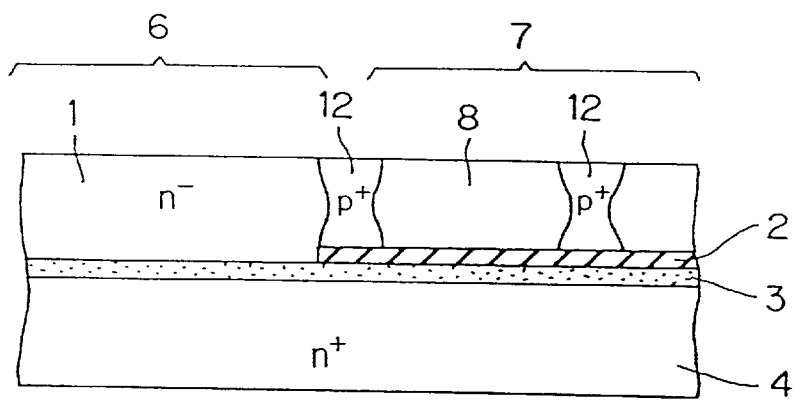

Next, an insulation film 2 composed of a silicon oxide film or a silicon nitride film is formed over the entire surface by thermal oxidation or low-temperature CVD, and the protruding step portion of the insulation film 2 is removed by a method such as grinding-polishing or etching, after which the surface is further subjected to a leveling process to produce an even surface having surface irregularities no greater than several 100 Å over the wafer surface (FIG. 6b).

Next, as shown in FIG. 6c, a polycrystalline silicon layer 3 is formed by a method such as CVD and impurities are introduced as necessary. Mechanical and chemical grinding is then applied to grind and level the polycrystalline silicon layer 3 as far as the X—X plane and to reduce surface irregularities within the wafer surface to a maximum of several tens of Å.

Next, as shown in FIG. 6d, one main surface of an n+-type silicon single crystal substrate 4 having an impurity concentration on the order of $10^{18}/cm^3$ and the extremely even surface of the polycrystalline silicon layer 3 formed on the n−-type silicon single crystal substrate 1 are bonded together and subjected to heat treatment at 1100–1200° C. for about two hours to obtain a single firmly bonded compound substrate.

The other main surface of the n−-type silicon single crystal substrate 1 is next ground and polished as far as the Y—Y plane and leveled to leave a silicon single crystal with an SOI layer thickness of about 20 μm. A photoresist pattern is then formed by photolithography, and this is used as a mask to ion-inject boron at an energy of 50 keV and a dosage of $5 \times 10^{15}/cm^2$ to form p+-type diffusion layers 12b (FIG. 6e).

A heat treatment is then carried out to join the upper and lower diffusion layers 12a, 12b and form p+-type isolation zones 12 which both isolate the vertical power element formation zone 6 and control circuit element formation zone 7 as well as divide the silicon single crystal substrate 1 in the control circuit element formation zone 7 into silicon single crystal islands 8 (FIG. 6f).

This embodiment is ideal for applications in which isolation cannot be achieved using the isolation technique of the third embodiment (FIG. 5) due to thickness of the SOI layer.

Furthermore, the heat treatment for joining the upper and lower p$^+$-type diffusion layers 12a, 12b may also be substituted by the heat treatment of the element forming process.

Figure 7:
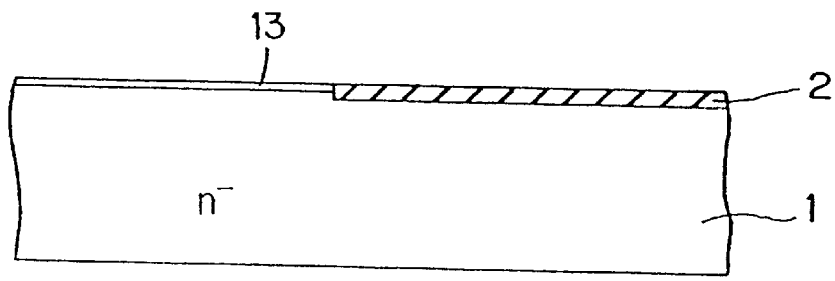
FIGS. 7a to 7c are sectional views illustrating the process of the SOI substrate manufacturing method according to the fifth embodiment of the present invention.
Figure 7:
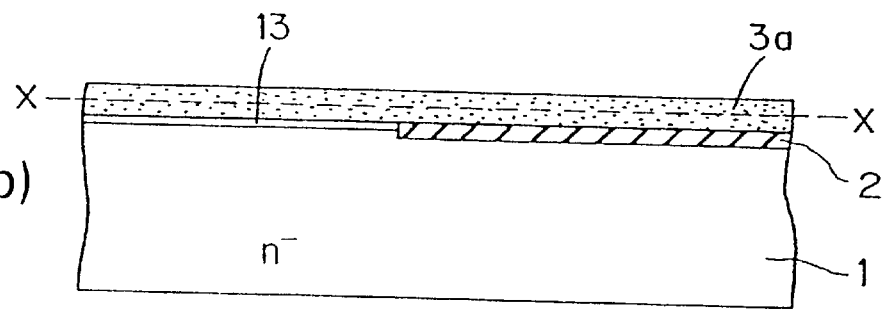
Figure 7:
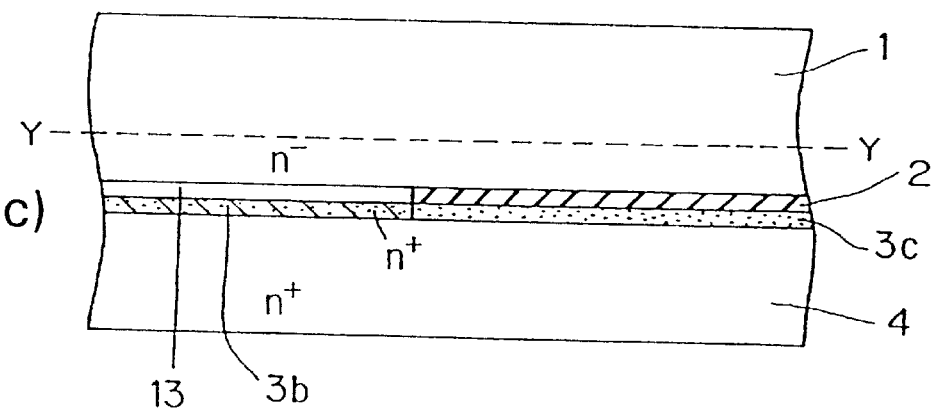

Fifth Embodiment:

FIGS. 7a–7c are sectional views of the progression of steps illustrating the manufacturing method according to the fifth embodiment of the present invention.

Using the same techniques as for the first embodiment, an n$^-$-type silicon single crystal substrate 1 having a buried insulation film 2 in portions is formed as shown in FIG. 3b, and after applying a leveling process, impurities of the same conductive type as the substrate are introduced into the surface of the n$^-$-type silicon substrate by a method such as ion injection at a concentration greater than that of the substrate concentration to form an n$^+$-type diffusion layer 13 (FIG. 7a).

Next, using SiH$_4$ as the raw material gas, silicon is grown by CVD with an interior furnace temperature of 600–700° C. to form a nondoped polycrystalline silicon layer 3a (FIG. 7b).

The nondoped polycrystalline silicon layer 3a is then ground to the X—X plane to level the surface such that maximum surface irregularities are several tens of Å.

A main surface of the n$^+$-type silicon single crystal substrate 4 and the surface of the extremely even polycrystalline silicon layer formed on a main surface of the n$^-$-type silicon single crystal substrate 1 are then bonded together and subjected to heat treatment at 1100–1200° C. to obtain a single firmly bonded compound substrate. At this time, the impurities of the n$^+$-type diffusion layer 13 formed on the surface of the silicon single crystal substrate 1 and the impurities of the n$^+$-type silicon single crystal substrate 4 diffuse into the nondoped polycrystalline silicon layer 3a and convert this layer into an n$^+$-type polycrystalline silicon layer 3b and an n-type polycrystalline silicon layer 3c (FIG. 7c).

In addition, the impurities of the n$^+$-type diffusion layer 13 formed on the surface of the n$^-$-type silicon single crystal substrate 1 and the impurities of the n$^+$-type silicon single crystal substrate 4 are not only introduced into the polycrystalline silicon by the above-described bonding heat treatment, but also by the heat treatment during subsequent device forming processes.

The compound substrate is next ground and polished to the Y—Y plane (FIG. 7c), and isolation zones are further formed to obtain an SOI substrate according to the present embodiment.

As impurities for forming the n$^+$-type diffusion layer 13, phosphorus, arsenic (As), and antimony (Sb) may be used. Moreover, instead of forming a high-concentration impurity diffusion layer on the substrate surface on the n$^-$-type silicon single crystal substrate 1 side, an n-type impurity may be introduced into the substrate surface on the n$^+$-type silicon single crystal substrate 4 side.

Although explanation has been presented in the foregoing description regarding preferable embodiments, the present invention is not limited to these embodiments, and various changes may be made without departing from the scope of the invention. For example, although in the embodiments an insulation film is buried and a polycrystalline silicon layer is formed on the n$^-$-type silicon single crystal substrate side, these may also be formed on the n$^+$-type silicon single crystal substrate side.

What is claimed is:

1. An SOI substrate wherein a first silicon single crystal substrate and a second silicon single crystal substrate are bonded together, said first silicon single crystal substrate being formed thin as an SOI layer, an insulation film being buried in portions of the surface of the bonding side of said first silicon single crystal substrate, and, a polycrystalline silicon layer being formed on the surface of the bonding side of said first silicon single crystal substrate into which the insulation film is buried.

2. An SOI substrate according to claim 1 wherein a conductive impurity diffusion layer at a concentration greater than that of the first silicon single crystal substrate is formed on a portion of either one of said silicon single crystal substrates that contacts said polycrystalline silicon layer.

* * * * *